United States Patent [19]

Martin et al.

[11] Patent Number: 4,564,563

[45] Date of Patent: Jan. 14, 1986

[54] SOLDERABLE CONDUCTOR

[75] Inventors: F. Wayne Martin, Baldwin Place; Samson Shahbazi, Yonkers; Ronald J. Schoonejongen, Carmel, all of N.Y.

[73] Assignee: Electro Materials Corp. of America, Mamaroneck, N.Y.

[21] Appl. No.: 537,740

[22] Filed: Sep. 30, 1983

[51] Int. Cl.$^4$ .............................................. H01B 3/30
[52] U.S. Cl. .................................... 428/546; 523/458; 252/514; 428/901
[58] Field of Search .......................... 427/96; 252/514; 523/437, 458

[56] References Cited

U.S. PATENT DOCUMENTS

| | | | |
|---|---|---|---|
| 2,959,498 | 11/1960 | Sweeny | 117/212 |
| 3,814,703 | 6/1974 | Nakayama et al. | 257/500 |
| 3,932,311 | 1/1976 | Caldwell | 252/514 |
| 4,051,094 | 9/1977 | Reuter et al. | 260/29.6 |
| 4,327,124 | 4/1982 | DesMarais | 427/96 |
| 4,371,459 | 2/1983 | Nazarenko | 252/514 |
| 4,410,457 | 10/1983 | Fujimura | 252/514 |
| 4,419,279 | 12/1983 | Abrams | 252/514 |

FOREIGN PATENT DOCUMENTS

| | | | |
|---|---|---|---|
| 2938465 | 4/1981 | Fed. Rep. of Germany | 252/514 |
| 0102930 | 9/1978 | Japan | 252/514 |

Primary Examiner—John E. Kittle
Assistant Examiner—James J. Seidleck

[57] ABSTRACT

A solderable electrically conductive composition includes metallic silver particles embedded in a matrix formed from acrylic, carboxylated vinyl and epoxy. The composition is formed by dissolving acrylic powder and vinyl powder in respective solvents to form a first solution and a second solution. The solutions are then mixed with metallic silver particles and an epoxy to form an ink which is applied to a substrate to form a film thereon. The film is cured to evaporate the solvents and allow polymerization to occur thereby leaving a solderable electrically conductive film, formed from metallic silver particles embedded in a matrix containing acrylic, vinyl and epoxy, on the substrate.

7 Claims, No Drawings

SOLDERABLE CONDUCTOR

The invention relates to the field of conductive film and more particularly to a solderable electrically conductive silver polymer film.

Conductive polymer films are well known, and used in connection with printed circuits to connect the elements of the circuits and to provide an electrical connection to other circuits. Most of these conductive polymer films contain noble metals such as silver or gold to render them conductive.

Typically, the films are applied to a substrate, such as a circuit board, by silk screening methods and then cured. Present conductive polymer films will not accept solder and require the application of a plated metal surface which is solderable. The plated metal surface may be applied by either electroless or electroplate techniques. Electrical connections may then be made to the conductive film by soldering the electrical leads to the plated metal surface. Soldering must be performed very carefully as the conductive polymer films containing silver are subject to leaching, which is the dissolving of the silver into the solder during soldering, often resulting in the removal of the conductive silver from the substrate and rendering the substrate unusable.

The plating of presently available conductive polymer films is required to render them solderable. The plating currently applied to most conductive polymer films is an electroless bath of either nickel boron or nickel phosphorus. Plating, however, is inconvenient on a small scale and presents major problems where substantial production of plated conductive polymer films (such as in printed circuit boards) is contemplated. For example, electroless nickel plating of conductive polymer films on a volume production basis requires the establishment of a suitable plating facility which is a large, expensive and complicated venture. Specifically, the plating room must have a suitable quantity and quality of ventilation and the various levels of air flow must be controlled. The tanks used for plating should be formed from fiberglass, polypropylene, polyethylene or other suitable high temperature resistant (200° F. range) material. The tanks must also be capable of withstanding nitric acid cleaning on a periodic basis. In addition, a holding tank and a transfer system is required to empty and refill the plating tank when nickel salts reach a certain concentration requiring that the tank be purged. Low watt density immersion heaters made of quartz or passivated stainless steel are necessary to provide the appropriate level of heat. The use of immersion heaters require agitation by forced air impinging directly on the heaters to avoid localized heating. Jacketed tanks may be used in place of the immersion heaters but vigorous agitation is required in any case. The use of non-metallic or other acid resistant products is recommended. Continuous filtration of the plating bath must be performed each day. A polypropylene cartridge filter is recommended, which filter should be purged with hot water and the cartridge filter changed 6 to 10 times per hour for continuous filtration. Of course, the continuous filtration requires a pump suitable for continuous operation at 200° F.

It will readily be appreciated that a solderable conductive film would eliminate the need for the entire plating operation described above and is therefore highly desirable. In addition, a solderable conductive film in which the conductive particles are resistent to leaching would also be desirable.

Accordingly, one object of the present invention is to provide an electrically conductive film which is solderable.

Another object of the present invention is to provide an electrically conductive film which is solderable without the application of a plated metal surface or any other subsequent coating operation.

Still another object of the present invention is to provide an electrically conductive film which is solderable by any standard soldering technique.

A further object of the present invention is to provide a solderable electrically conductive film in which the conductive particles will not leach off the substrate during normal soldering.

A still further object of the present invention is to provide a solderable film which is highly electrically conductive.

In accordance with the present invention, a solderable electrically conductive composition includes metallic silver particles embedded in a matrix formed from acrylic, carboxylated vinyl and epoxy. The composition is formed by dissolving vinyl powder and acrylic powder in respective solvents to form a first and second solution. The solutions are then mixed with metallic silver particles and epoxy to form an ink, which is applied to a substrate to form a film thereon. The film is cured to evaporate the solvents and allow polymerization to occur thereby leaving a solderable electrically conductive film, formed from metallic silver particles embedded in a matrix containing acrylic, vinyl and epoxy, on the substrate.

The solderable electrically conductive composition of the present invention is made up of metallic silver particles embedded in a matrix containing acrylic, carboxylated vinyl and a moderate chain-length epoxy. The composition is formed by dissolving a suitable acrylic powder such as Acryloid B66, which is the registered trademark of the Rohm and Haas Company for a methyl/butyl methacrylate copolymer, in a solvent such as butyl carbitol acetate to form a liquid acrylic resin. A liquid vinyl resin is formed by dissolving carboxylated vinyl powder in a solvent, such as butyl carbitol acetate. The acrylic resin and vinyl resin are then mixed together with the silver particles and the epoxy to form an ink. The silver particles may be either in a granular powder or flake form with a typical particle size of 1 to 10 microns. Any suitable moderate chain length epoxy may be used such as the epoxy sold under the trademark 828 by Shell, the epoxy sold under the trademark Lonco PC No. 549 Solder Resist by London Chemical Co. or the epoxy sold under the trademark 9440 Solder Resist by MacDermid Inc.

Each of the materials are weighed in clean stainless steel bowls. The vinyl and acrylic are then dissolved in solvents to form the acrylic resin and vinyl resin. The silver particles, epoxy and vinyl and acrylic resins are then blended with a mixer until the silver powder is dispersed, thereby forming an ink. The silver powder should make up from 68 to 75% by weight of the ink with a preferred amount being 70%. The acrylic resin should make up from 14 to 20% by weight of the ink with a preferred amount being 16%. The ratio of acrylic powder to solvent in the resin is 40% acrylic to 60% solvent. The vinyl resin should make up from 12 to 15% by weight of the ink with a preferred amount being 12%. The ratio of vinyl powder to solvent in the resin is 50% vinyl to 50% solvent. The epoxy should make up from 1.5 to 2.5% by weight of the ink with a preferred amount being 2%.

The ink is then milled using a 3-roll mill until the desired fineness of grind is achieved. This may require 3 to 6 passes through the 3-roll mill. A fineness of grind of 7 microns or less is desirable.

The viscosity of the ink may be lowered with the addition of more solvent in 0.5% by weight increments. A viscocity of 50,000 to 90,000 centipoise (cps) is desired for most applications. The ink may then be applied to any substrate capable of withstanding the curing temperature of the ink. Typical substrates include those formed from epoxy and fiberglass. For example, the ink may be screen printed onto conventional circuit boards to connect one element of a circuit to another or to provide an electrical connection to another circuit. For this application the ink may be screen printed using conventional silk screening methods to form lines of conductive film as narrow as 10 mils in width and with a spacing of as little as 10 mils from other lines. The ink may also be applied to the leads of surface mounted devices such as capacitors, light emitting diodes, solar cells, dual in-line package integrated circuits and small outline integrated circuit packages. For this application the leads of the surface mounted devices may be dipped in the ink or the ink may be sprayed onto the leads. The ink may also be used to provide the leads for leadless surface mounted devices.

The ink forms a film on the substrate which then must be cured. The film is cured by exposing the substrate to an ambient temperature between 150° to 170° centigrade (C.) for 40 to 50 minutes. This may be done by placing the substrate in a convection oven, having a nitrogen or oxygen atmosphere.

During curing, the solvents are evaporated and polymerization occurs, leaving a hard, solderable, electrically conductive film formed from metallic silver particles embedded in a matrix formed from acrylic, carboxylated vinyl and epoxy. The film adheres well to the substrate, requiring more than two pounds of force to remove it therefrom.

It will readily be appreciated that the metal content of the cured film is greater than the metal content of the ink as the solvent evaporates during curing. The metallic silver particles make up from 82 to 88% by weight of the cured film with a preferred amount being 82%. The acrylic makes up from 6 to 9% by weight of the cured film with a preferred amount being 7%. The carboxylated vinyl makes up from 7 to 9% by weight of the cured film with a preferred amount being 7%. The epoxy makes up from 1.7 to 3% by weight of the cured film with a preferred amount being 2%. The cured film retains its adhesion properties and cohesive strength. It is believed that the epoxy gives the film good adhesive properties to insure that the film sticks to the substrate to which it is applied. In addition, the epoxy makes the silver particles of the film slightly solder resistant thereby preventing the leaching (dissolving into the solder) of the silver particles during soldering.

The cured film provides good electrical conductivity having a resistivity of 0.2 ohms per square per mil thick. Any size square of the cured film having a thickness of 1 mil will have a resistivity of 0.2 ohms. In addition, the film exhibits solderability in that the solder adheres directly to the film and as a result no plating or any subsequent coating operation is necessary. Solder may be applied by use of a soldering iron or any standard soldering technique. No special flux is required and standard activated rosin flux may be used. In addition, the cured film may be soldered by a solder dip process without creating a solder leach problem. For example, the cured film may be dipped for 5 seconds into a solder bath having a temperature of 200° C. without the solder dissolving the silver particles off the substrate.

As will be readily apparent to those skilled in the art, the invention may be used in other specific forms or for other purposes without departing from its spirit or central characteristics. The present embodiments are therefore to be considered as illustrative and not restrictive, the scope of the invention being indicated by the claims rather than by the foregoing description, and all embodiments which come within the range of equivalence of the claims are intended to be embraced.

We claim:

1. A solderable electrically conductive composition comprising metallic silver particles embedded in a matrix formed from acrylic, carboxylated vinyl and an epoxy, in which said metallic silver particles make up approximately 82% by weight of said composition, said acrylic makes up from 6 to 9% by weight of said composition, said carboxylated vinyl makes up from 7 to 9% by weight of said composition and said epoxy makes up from 1.7 to 3% by weight of said composition.

2. A composition as in claim 1 in which said metallic silver particles make up approximately 82% by weight of said composition, said acrylic makes up approximately 7% by weight of said composition, said carboxylated vinyl makes up approximately 7% by weight of said composition and said epoxy makes up approximately 2% by weight of said composition.

3. An article comprising a substrate carrying a solderable electrically conductive composition comprising metallic silver particles embedded in a matrix formed from acrylic, carboxylated vinyl and an epoxy in which said metallic silver particles make up approximately 82% by weight of said composition, said acrylic makes up from 6 to 9% by weight of said composition, said carboxylated vinyl makes up from 7 to 9% by weight of said composition and said epoxy makes up from 1.7 to 3% by weight of said composition, said composition being capable of accepting solder.

4. The article of claim 3 in which said metallic silver particles will not leach off the substrate during soldering.

5. An article as in claim 3 in which said substrate is a circuit board.

6. An article as in claim 3 in which said substrate is a lead of an electrical device.

7. An article as in claim 3 in which said substrate is a leadless electrical device in which said composition forms an electrical lead.

* * * * *